United States Patent [19]

Goo

[11] Patent Number: 5,328,862
[45] Date of Patent: Jul. 12, 1994

[54] METHOD OF MAKING METAL OXIDE SEMICONDUCTOR FIELD EFFECT TRANSISTOR

[75] Inventor: Jung S. Goo, Seoul, Rep. of Korea

[73] Assignee: Goldstar Electron Co., Ltd., Rep. of Korea

[21] Appl. No.: 52,092

[22] Filed: Apr. 22, 1993

[30] Foreign Application Priority Data

Jun. 12, 1992 [KR] Rep. of Korea ............... 10235/1992

[51] Int. Cl.$^5$ .......................................... H01L 21/265
[52] U.S. Cl. ...................................... 437/41; 437/44; 437/45; 437/40
[58] Field of Search ...................... 437/40, 41, 44, 45, 437/46

[56] References Cited

U.S. PATENT DOCUMENTS

| 4,771,014 | 9/1988 | Liou et al. | |
|---|---|---|---|
| 4,968,639 | 11/1990 | Bergonzoni. | |
| 5,061,649 | 10/1991 | Takenouchi et al. | |
| 5,064,774 | 11/1991 | Pfiester | 437/46 |
| 5,082,794 | 1/1992 | Pfiester et al. | 437/44 |
| 5,102,816 | 4/1992 | Manukonda et al. | |
| 5,120,673 | 6/1992 | Itoh | 437/44 |
| 5,122,474 | 6/1992 | Harrington, III | 437/44 |
| 5,146,292 | 9/1992 | Watanabe et al. | 437/44 |
| 5,200,352 | 4/1993 | Pfiester | 437/44 |
| 5,219,777 | 6/1993 | Kang | 437/44 |

Primary Examiner—Brian E. Hearn
Assistant Examiner—Kevin M. Picardat
Attorney, Agent, or Firm—Poms, Smith, Lande & Rose

[57] ABSTRACT

A method of making a MOSFET with a LDD structure capable of minimizing the junction capacitance and the number of manufacturing process.

The method comprises the steps of forming a field oxide on a P type substrate, forming a gate oxide on the active region, forming sidewall spacers with a nitride film at side surfaces of the gate,
 implanting a high concentration impurity of N+ type self-aligning with the spacers as a mask to form high concentration source/drain regions of N+ type, removing the sidewall spacers,
 forming a thick oxide film on the active region between the field oxide and the gate,
 implanting a low concentration impurity of N− type and a low concentration impurity of P− type by self-aligning with the thick oxide as a mask to form low concentration source/drain regions of N− type coming into contact with high concentration source/drain regions of N+ type and to form low concentration impurity regions of P− type enclosing the low concentration source/drain regions of N− type.

12 Claims, 7 Drawing Sheets

METHOD OF MAKING METAL OXIDE SEMICONDUCTOR FIELD EFFECT TRANSISTOR

BACKGROUND OF THE INVENTION

Field of the Invention

The present invention relates to a metal oxide semiconductor field effect transistor, and more particularly to a method of making a metal oxide semiconductor field effect transistor with a lightly doped drain structure capable of reducing a threshold voltage and a junction capacitance, and simultaneously simplifying a manufacturing process. According to a general metal oxide semiconductor field effect transistor (MOSFET) with a lightly doped drain (LDD) structure, hot carriers are generated due to a high electric field formed at edge portions of its gate electrode. In a case that the generated hot carriers are trapped in a gate insulating film, a defect is generated in the gate insulating film, thereby causing the operation characteristic of the MOSFET to be deteriorated and the life time of the MOSFET to be shortened.

Figure 1A:
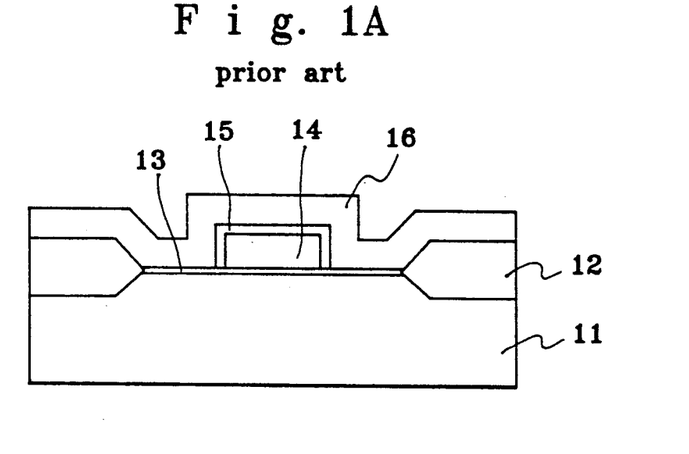
FIG. 1A to 1C are sectional views illustrating a method of making a conventional MOSFET with a LDD structure for preventing an occurrence of a hot carriers effect.
Figure 1B:
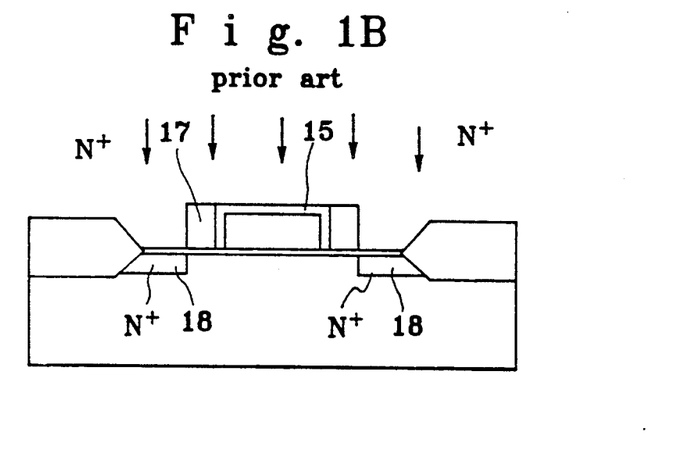
Figure 1C:
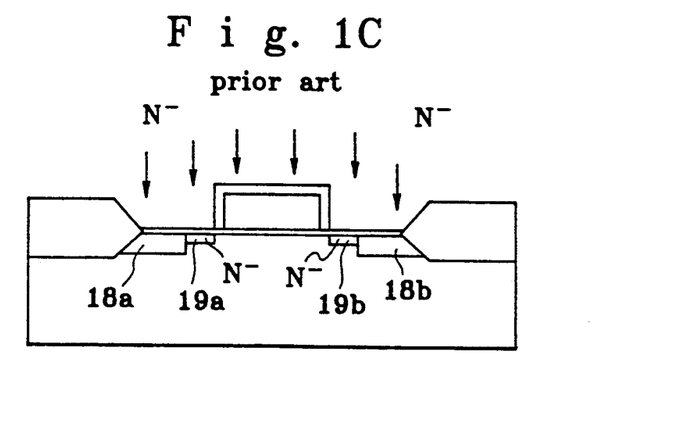

So as to reduce the hot carrier effect, a MOSFET with a LDD structure such as FIG. 1C has been suggested.

On a P type semiconductor substrate 11, first, field oxide films 12 are formed to isolate adjacent cells from one another, as shown in FIG. 1A. Thereafter, a gate insulating film 13 is formed over the entire surface of P type semiconductor substrate 11 including the field oxide films 12. On the gate insulating film 13, a gate electrode 14 having a certain width is formed within each active region.

The exposed surface of gate electrode 14 is subjected to an oxidization, thereby forming a gate cap oxide film 15.

Over the entire exposed surface, a polysilicon layer 16 with a certain thickness is formed to provide gate side walls. Subsequently, the polysilicon layer 16 is subjected to an anisotropic etching using a reactive ion etching (RIE) method, thereby forming gate side walls 17 at sidewalls of the gate electrode 14, respectively, as shown in FIG. 1B.

At this time, the gate cap oxide film 15 formed on the surface of gate electrode 14 serves as an etch stopper.

By using the gate cap oxide film 15 and gate sidewalls 17 as a mask, N+ type (namely, high concentration) impurity ions are then implanted in a portion of the surface of P type semiconductor substrate 11 corresponding to the active region. According to a diffusion of the impurity ions, N+ type source and drain regions 18a, 18b are formed in the active region between the field oxide films 12 and gate sidewalls 17. Thereafter, the gate sidewalls 17 are removed, as shown in FIG. 1C.

By performing a self-alignment with the gate cap oxide film 15 as a mask, N− type (namely, low concentration) impurity ions are then implanted in a portion of the surface of P type semiconductor substrate 11 corresponding to the active region. According to a diffusion of the impurity ions N− type source and drain regions 19 and 19a are formed in the active region between the gate cap oxide film 15 and the N+ type source and drain regions 18a and 18b. Accordingly, the source and drain regions of MOSFET form a LDD structure comprising low and high concentration impurity regions.

According to the LDD structure of MOSFET shown in FIG. 1C, a hot carrier effect due to a high electric field can be reduced. Since the source and drain regions comprise $N^{31}$ type impurity regions and N+ type impurity regions, however, a resistance is increased, thereby causing the slow operation speed.

In addition, it is impossible to obtain source and drain regions having desired accurate widths, due to the difficulty of accurately controlling the thickness of the gate sidewalls. Consequently, a short channel is caused.

So as to reduce the short channel effect, P type impurity ions should be doped with a high concentration in P type semiconductor substrate. As a method for obtaining P type high concentration substrate, P type impurity ions are overall implanted with a high concentration in P type semiconductor substrate. As another method, P type impurity ions are partly implanted in P type substrate to additionally form P type impurity regions enclosing N− type source/drain regions and N+ type source/drain regions.

The short channel effect of MOSFET with a LDD structure can be reduced by the above two methods.

However, a threshold voltage of MOSFET and a junction capacitance of source/drain regions are increased in proportion to a doping concentration of an impurity.

Since a MOSFET with a LDD structure according to the above methods has a semiconductor substrate having a higher concentration, as compared with a conventional MOSFET with a LDD structure, the threshold voltage and the junction capacitance are increased, thereby causing the characteristic of MOSFET in operation to be deteriorated.

FIG. 2A to FIG. 2F show manufacturing sectional views of a MOSFET with a LDD structure which is capable of reducing the short channel effect and the junction capacitance of source/drain regions.

Figure 2A:
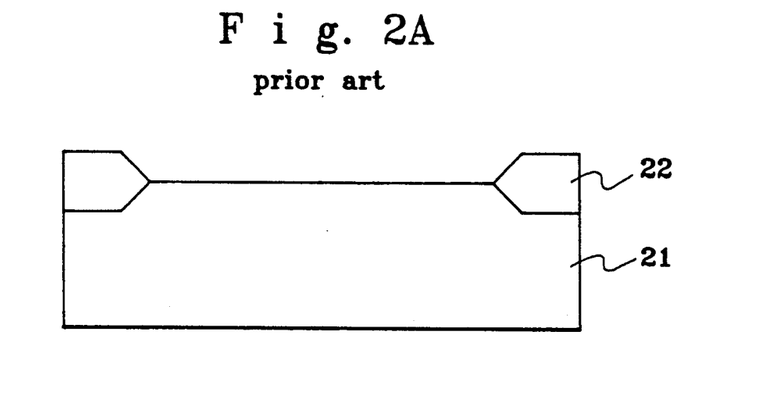
FIG. 2A to 2F are sectional views illustrating a method of making a conventional MOSFET with a LDD structure for preventing a short channel effect.

Referring to FIG. 2A, field oxide films 22 are formed on P type substrate 21 by performing a conventional local oxidation of silicon (LOCOS) process to define field regions and active regions.

Figure 2B:
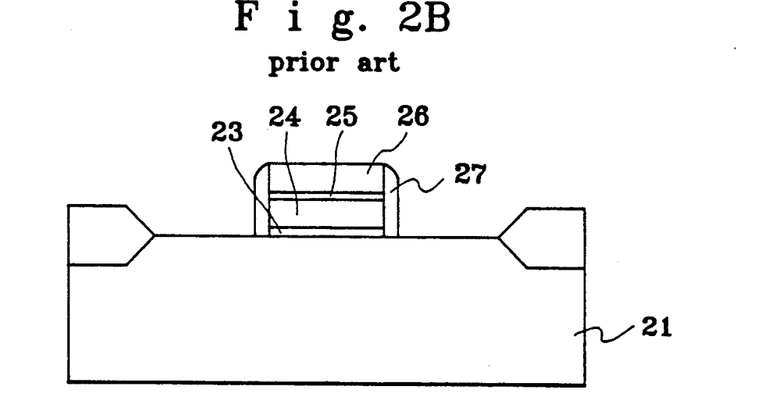

As shown in FIG. 2B, a gate oxide film 23, a first polysilicon film 24, a nitride film and a second polysilicon film 26 are formed in this order and then the second polysilicon film 26, the nitride film, the first polysilicon film 24 and the gate oxide film are patterned in this order so as to form a gate with a triple structure.

Figure 2C:
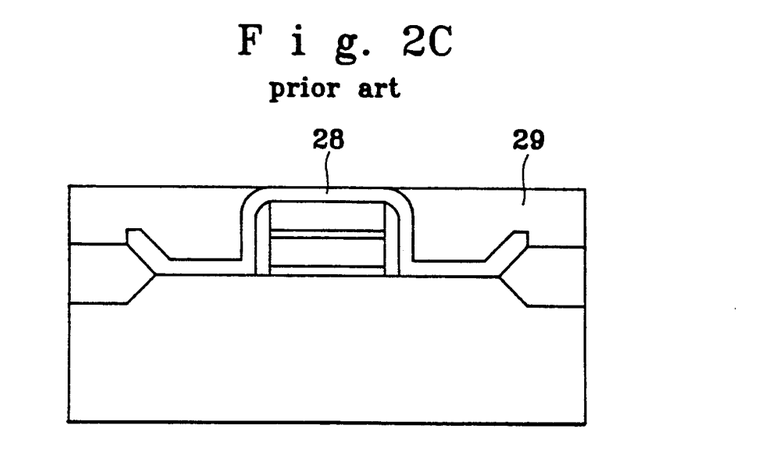

Thereafter, an oxide film is formed on the whole surface of P type substrate 21 and then the oxide film is anisotopically etched with a RIE method to form side wall oxide films 27. As shown in FIG. 2C, a third polysilicon film 28 doped with N+ type impurity is formed on the whole surface of P type substrate 21.

Thereafter, the third polysilicon film 28 is selectively etched such that it is merely remained in the active region between the field oxide films 22.

Over the whole surface of P type substrate 21, a photoresist film 29 is coated and then the photoresist film 29 is etched back until the surface of the third polysilicon film 28 is exposed.

Figure 2D:
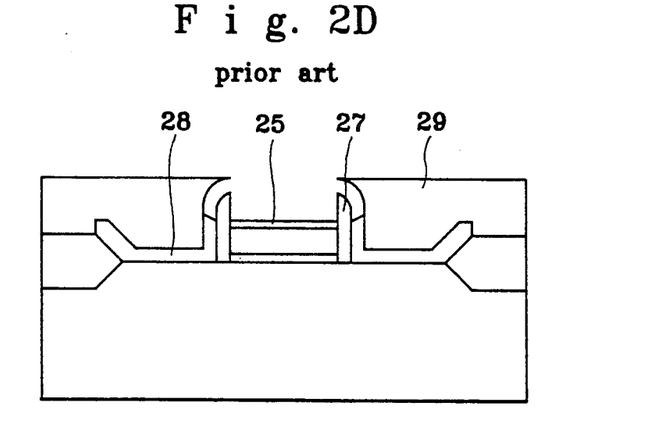

As shown in FIG. 2D, the second polysilicon 26 and the third polysilicon film 28 are etched until the surface of the nitride film 25 formed on the gate electrode 24 is exposed.

At this time, the second polysilicon 26 and the third polysilicon 28 formed on the gate electrode 24 are all removed, thereby there remains only the third polysilicon film 28 doped with N+ type impurity on the active region between the gate electrode 24 and the field oxide films 22.

At this time, the remaining third polysilicon film 28 doped with N+ type impurity serves as a diffusion source for forming N+ type source/drain regions, upon performing the following impurity diffusion process for forming source/drain regions. The nitride film 25 exposed on the gate electrode 24 serves as an etch stopper, upon the performance of the above etching process.

Figure 2E:
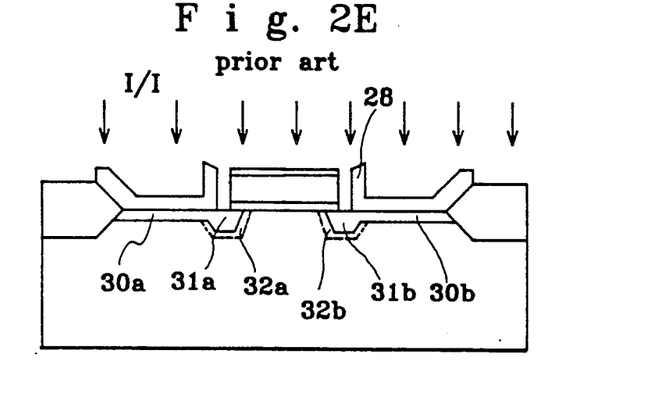

As shown in FIG. 2E, the photoresist film 29 and the side wall oxide film 27 are removed in this order.

By using the gate electrode (24) and the remaining polysilicon film (28) as a mask, N− type (low concentration) impurity ions and P− type impurity ions are then implanted.

According to a diffusion of the $N^{31}$ type impurity ions and the P− type impurity ions, N− type source and drain regions 18a and 18b are formed.

At this time, N+ type impurity ions are also diffused from the polysilicon film 28 doped with N+ type impurity ions, thereby N+ type (high concentration) source and drain regions 30a and 30b are formed. simultaneously, P− type impurity ions are also diffused, thereby forming P− type (low concentration) impurity regions 32a and 32b.

In the above ion-implantation process, since N− type impurity ions and P− type impurity ions are implanted using the third polysilicon film 28 and the gate electrode 24 in which N− type impurity ions and P− type impurity ions are remained, as a mask, N+ type source and drain regions 31a and 32b are formed such that they are contacted with N+ type source and drain regions 30a and 30b, respectively, and P− type (low concentration) impurity regions 32a and 32b are formed such that N− type source and drain regions 31a and 31b are merely enclosed by them, respectively.

Figure 2F:
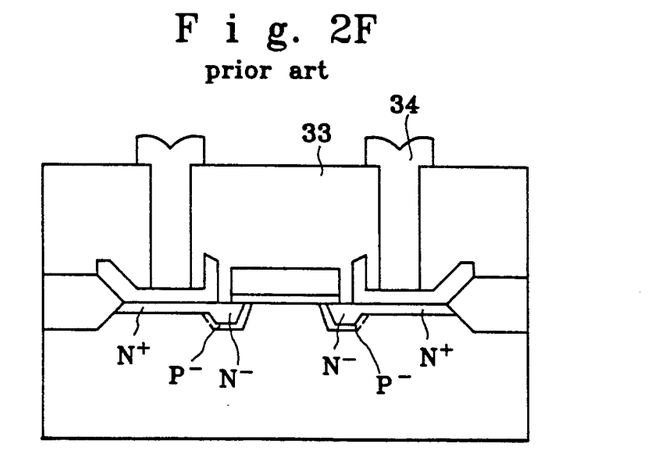

As shown in FIG. 2F, a SOG film 33 for planarization is formed over the whole surface of P+ type substrate 21. The SOG film 33 is subjected to an etching process to form a contact for inter-connecting source/drain regions with the third polysilicon 28. Thereafter, a metal electrode 34 is finally formed.

Since P− type impurity regions are formed such that they merely enclose N− type source and drain regions, as shown in FIG. 2F, the MOSFET with a LDD structure shown in FIG. 2F has an advantage capable of more reducing a junction capacitance and a threshold voltage, as compared with a conventional MOSFET with a LDD structure in which P− type impurity regions enclose all of N− type (low concentration) source and drain regions and N+ type (high concentration) source and drain regions. However, the MOSFET has a disadvantage, in that many processes such as the formation processes and the etching precesses of the first polysilicon film, the second polysilicon film and the nitride film are required, to form the gate with a triple structure.

The MOSFET also has another disadvantage, in that many manufacturing processes such as the deposition process and the etching process of the third polysilicon film which is used as a diffusion source to form high concentration source and drain regions and simultaneously is used for an inter connection of source and drain metal electrodes with source and drain impurity regions, coating of photoresist and etching-back should be all performed. Consequently, the conventional MOSFET with a LDD structure shown in FIG. 2F has a problem, in that the manufacturing process thereof becomes complicating.

SUMMARY OF THE INVENTION

Therefore, an object of the invention is to provide a method of making a MOSFET capable of reducing a junction capacitance and a threshold voltage.

Another object of the invention is to provide a method of making a MOSFET with a simplified LDD structure without increasing the number of manufacturing process and masking process. In order to the above objects, the present invention provides a method of making a metal oxide semiconductor field effect transistor comprising the steps of;

forming a field oxide film on a semiconductor substrate of a first conductivity type to define field regions and active regions:

forming a gate oxide film on the active regions;

implanting impurity ions in the active region to control a threshold voltage;

forming a polysilicon film on the whole surface of the gate oxide film;

etching the polysilicon film and the gate oxide film to form a gate electrode on the active regions;

forming an insulating film on the whole surface of the substrate;

anisotropically etching the insulating film with RIE method to form side wall spacers at side surfaces of the gate and the gate oxide film;

implanting an impurity of a second conductivity type by self-aligning with sidewall spacers as a mask to form high doped source/drain region of the second conductivity type;

forming a thick insulating film and a gate cap insulating film in this order;

removing the remaining insulating film for side wall spacers; and implanting impurities of the first conductivity type and the second conductivity type in the active region by self-aligning with a gate and the thick insulating film such that lightly doped source and drain regions of the first conductivity type are formed coming into contact with the highly doped source/drain regions and lightly doped impurity regions of the first conductivity type are formed enclosing the lightly doped source/drain regions of the second conductivity type.

DETAILED DESCRIPTION OF THE PREFERRED EMBODIMENTS

Hereinafter, the embodiments of the present invention will be described in detail, referring to the drawings.

FIG. 3A to 3E are sectional views illustrating a method of making a MOSFET with a LDD structure in accordance with a first embodiment of the present invention.

Figure 3A:
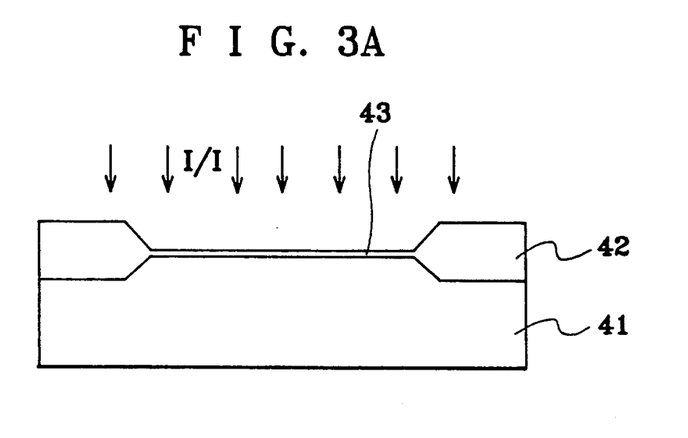
FIG. 3A to 3E are sectional views illustrating a method of making a MOSFET with a LDD structure in accordance with a first embodiment of the present invention.

As shown in FIG. 3A, a field oxide 42 is grown on a P type semiconductor substrate 41 with the conventional local oxidation of silicon (LOCOS) process to define a field region and an active region.

Thereafter, a gate oxide film 43 is formed on the active region to control a threshold voltage.

Figure 3B:
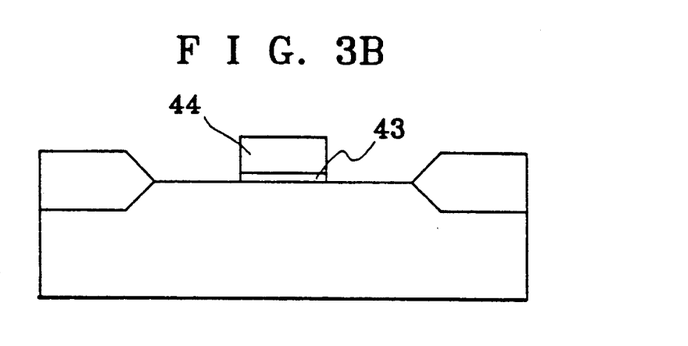

As shown in FIG. 3B, a polysilicon film 44 is deposited on the gate oxide film 43 and then the polysilicon film 44 and the gate oxide film 43 are etched to form a gate 44 on the active region.

Figure 3C:
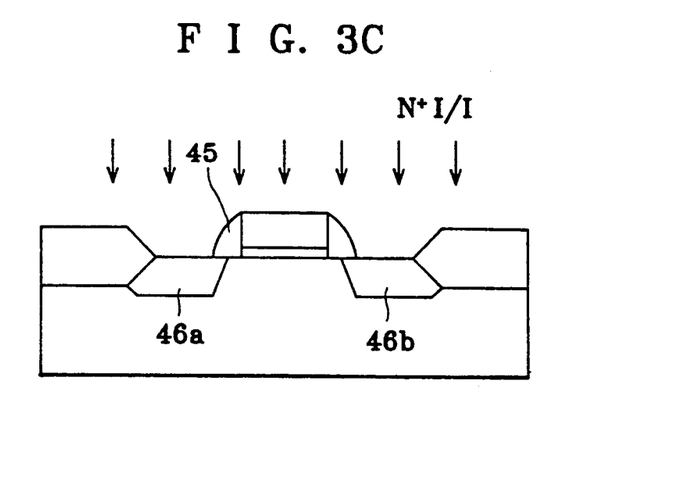

As shown in FIG. 3c, a nitride film is formed on the whole surface of the P type semiconductor substrate 41 and then the nitride film is anisotropically etched with a reactive ion etch (RIE) method which is a kind of dry etching method to form sidewall spacers 45 at side surfaces of the gate 44 and the gate oxide film 43.

Thereafter, by self-aligning with the sidewall spacers 45 as a mask, N+ type high concentration impurity ions are implanted in the active region between the field oxide 42 and the side wall spacers 45 to form N+ type high concentration source and drain regions 46a,46b.

Figure 3D:
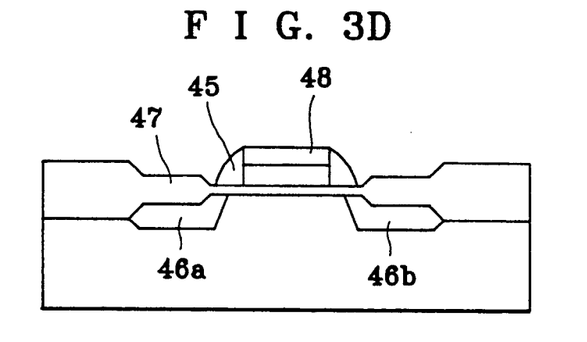

As shown in FIG. 3D, in a similar method to the formation of the field oxide 42, a LOCOS process is performed to form a thick oxide film 47 on the P type semiconductor substrate 41.

In this time, the sidewall spacers 45 which are formed with the nitride film act as a blocking means to limit the formation of the thick oxide film 47.

Therefore the thick oxide film 47 is formed merely on the active region between the field oxide 42 and the sidewall spacers 45 with a thickness of 1000Å to 1500Å.

Figure 3E:
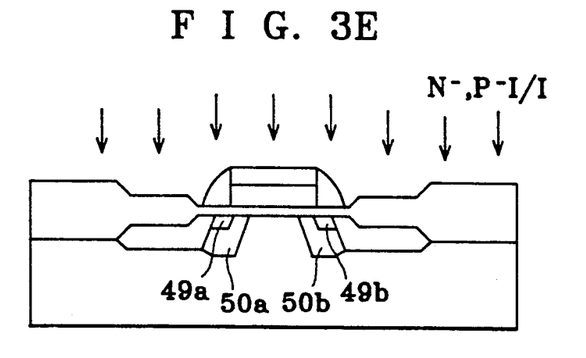

Upon the formation of the thick oxide film 47, the upper portion of the gate 44 formed with the polysilicon film is also oxidized, thereby forming a gate cap oxide film 48. As shown in FIG. 3E, a remaining nitride film is removed and then N− type impurity ions and P− type impurity ions are implanted in the active region in this order by self-aligning with the gate electrode 44 and the thick oxide layer 47 as a mask.

Therefore N− type low concentration source/drain regions 49a, 49b are formed coming into contact with N+ type high concentration source/drain regions 46a,46b in the active region between the gate electrode 44 and the thick oxide film 47.

Also $P^{31}$ type low concentration impurity regions 50a,50b are formed in the active region between the gate electrode 44 and the thick oxide film 47 such that they enclose the N− type low concentration source/drain regions 49a,49b respectively.

As a result, a MOSFET with a LDD structure which has N+ type high concentration (or high doped) source/drain regions 46a,46b and N− type low concentrain source/drain regions 49a,49b is manufactured.

That is, upon the implantation of the N− type impurity ions and the P− type impurity ions, the thick oxide film 47 acts as a blocking means which limits the implantation of the impurity ions. Therefore the N− type low concentration source/drain regions 49a,49b and the P− type low concentration impurity regions 50a,50b are formed merely in the active region between the thick oxide film 47 and the gate electrode 44 since the N− type low concentration impurity ions and the P− type low concentration impurity ions are not implanted through the thick oxide film 47.

FIG. 4A to FIG. 4E are sectional views illustrating a method of making a MOSFET in accordance with a second embodiment of the present invention.

The method of making a MOSFET according to the second embodiment of FIG. 4A to 4E and the method of making a MOSFET according to the first embodiment of FIG. 3A to 3E have a difference, in that the first embodiment merely uses one nitride film and the second embodiment uses a thin nitride film and a polysilicon film, as a material for sidewall spacers.

Figure 4A:
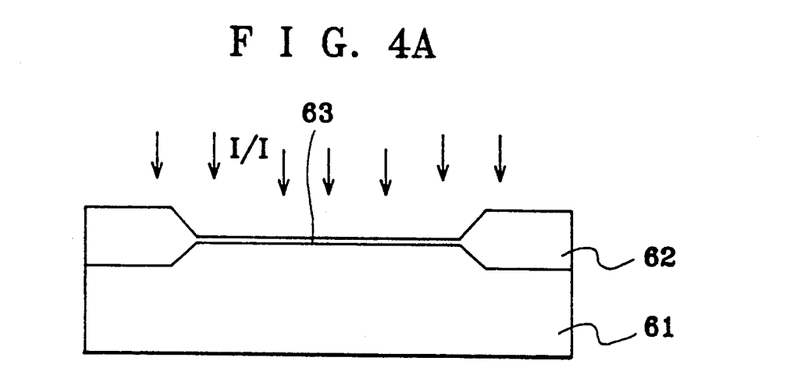
FIG. 4A to FIG. 4E are sectional views illustrating a method of making a MOSFET with a LDD structure in accordance with a second embodiment of the present invention.

As shown in FIG. 4A, first, a field oxide 62 is formed on a P type semiconductor substrate 61 with the conventional LOCOS process to define a field region and an active region. Thereafter, a gate oxide film 63 is formed on the active region and then impurity ions are implanted in the active region to control a threshold voltage.

Figure 4B:
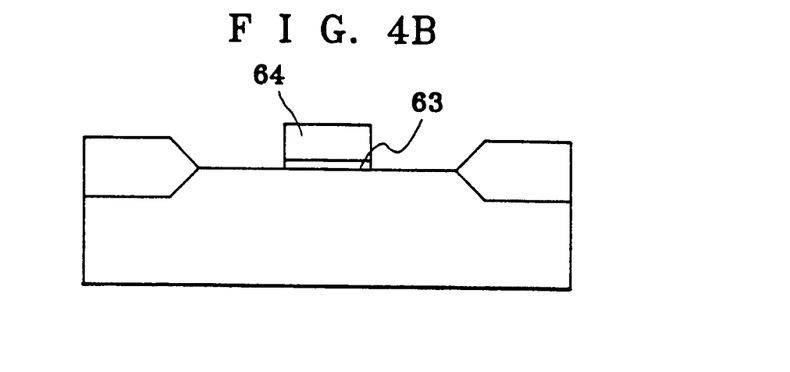

As shown in FIG. 4B, a polysilicon film 64 is deposited with a CVD method on the gate oxide film 63 and then the polysilicon film 64 is patterned together with the gate oxide film 63 to form a gate on the active region.

Figure 4C:
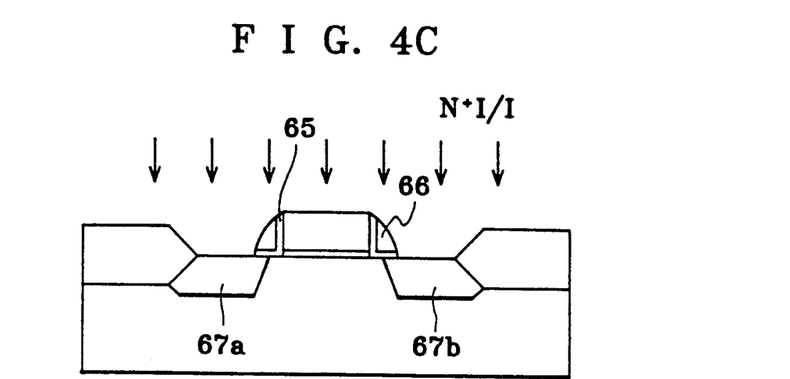

As shown in FIG. 4C, a thin nitride film 65 and a polysilicon film 66 are deposited in this order on the whole surface of the P type semiconductor substrate 61 and then the thin nitride film 65 and the polysilicon film 66 ae anisotropically etched with a RIE method, thereby to form sidewall spacers at side surfaces of the gate 64 and the gate oxide film 63. Thereafter, by self-aligning with the sidewall spacers as a mask, N+ type high concentration impurity ions are implanted in the active region to form N+ type high concentration source/drain regions 67a,68b in the active region between the field oxide 62 and the sidewall spacers.

Figure 4D:
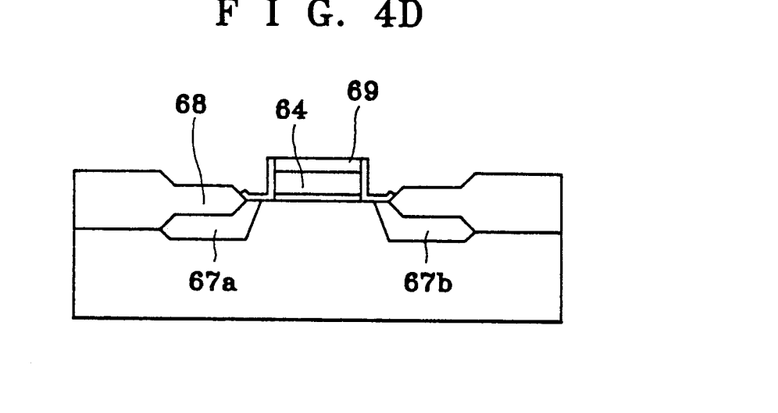

As shown in FIG. 4D, of a remaining polysilicon film 66 for sidewall spacers and a remaining nitride film 65 for sidewall spacers, the remaining polysilicon film 66 is removed and then a thick oxide film 68 is formed on the upper portions of the N+ type high concentration source/drain regions 67a,67b with a LOCOS process, in a similar method to the formation of the field oxide 62. Upon the formation of the thick oxide film 68, the remaining thin nitride film 65 serves as a blocking means, thereby to form the thick oxide film 68 with a thickness of 1000Å to 1500Å on the active region between the field oxide 62 and the nitride film 65.

On the other hand, upon the performance of the LOCOS process for forming the thick oxide film 68, the polysilicon film 64 for the gate electrode 64 is also oxidized at the upper portion thereof, thereby forming a gate cap oxide film 69 on the gate electrode 64.

Figure 4E:
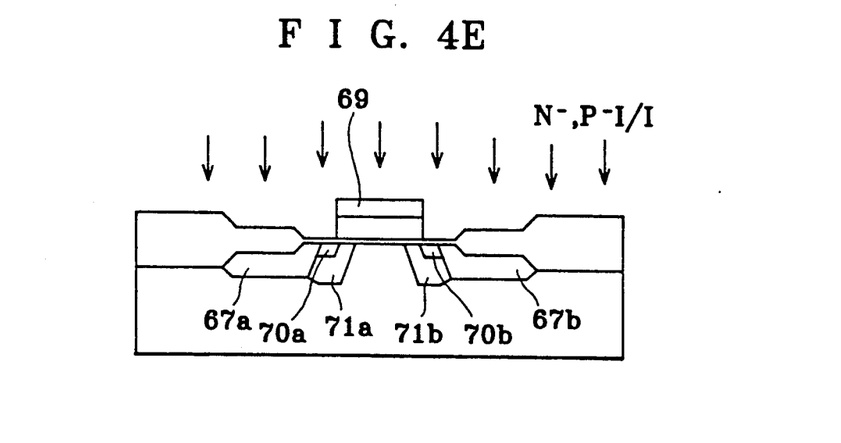

As shown in FIG. 4E, the remaining nitride film 65 is removed and then N− type impurity ions and P− type impurity ions are implanted in this order by self-aligning with the thick oxide film 68 and the gate electrode 64 as a mask.

As a result, N− type low concentration source/drain regions 70a,70b are formed coming into contact with N+ type high concentration source/drain regions 67a,67b in the active region between the thick oxide film 68 and the gate electrode 64.

Also, P− type low concentration impurity regions 71a,71b are formed in the active region between the thick oxide film 68 and the gate electrode 64 such that they enclose the N− type low concentration source/drain regions 67a,67b.

As a result, a MOSFET with a LDD structure which has N+ type high concentration source/drain regions 67a,67b and N⁻ type low concentration source/drain regions 70a,70b is manufactured.

As apparent from the above description, since the MOSFET with a LDD structure of the present invention has a P⁻ type low concentration impurity regions merely enclosing N⁻ type low concentration source/drain regions, it is possible to reduce a short channel effect, a junction capacitance and a threshold voltage.

Accordingly, the MOSFET of the present invention has a superior operation characteristic, as compared with the prior art.

Also, since this invention forms a thick oxide film with a conventional LOCOS process utilizing a nitride film for side wall spacers and performs the implantation of impurity ions self-aligning with the thick oxide film and the sidewall spacers as a mask, an additional process is not required, as compared with a conventional method of making a MOSFET.

Moreover, the method of the present invention does not have any masking process except a masking process for the formation the gate electrode.

Therefore, it is possible to make a MOSFET with a LDD structure without increasing the number of manufacturing process and masking process.

What is claimed is:

1. A method of making a metal oxide semiconductor filed effect transistor comprising the steps of;
   forming a field region in a substrate of a first conductivity type to define the field region and an active region;
   forming a gate insulating film on the active region;
   implanting an impurity in the active region to control a threshold voltage;
   forming a polysilicon film on the whole surface of the gate substrate;
   etching the polysilicon film and the gate insulating film to form a gate electrode on the active region;
   forming an insulating film on the whole surface of the substrate;
   anisotropically etching the insulating film with RIE method to form sidewall spacers at side surfaces of the gate electrode and the gate insulating film;
   implanting a high concentration impurity of a second conductivity type in the active region between the field region and the sidewall spacers to form high concentration source/drain regions of a second conductivity type, by self-aligning with the sidewall spacers as a mask;
   forming a thick insulating film and a gate cap insulating film;
   removing the insulating film for sidewall spacers; and
   implanting a low concentration impurity of a second conductivity type and a low concentration impurity of a first conductivity type self-aligning with the thick insulating film and the gate electrode as a mask, to form low concentration source/drain regions of a second conductivity type coming into contact with high concentration source/drain region in the active region and to form a low concentration impurity region of a first conductivity type enclosing low concentration source/drain regions of the second conductivity type in the active region.

2. A method of making a metal oxide semiconductor field effect transistor in accordance with claim 1, wherein said insulating film for sidewall spacers is a nitride film.

3. A method of making a metal oxide semiconductor field effect transistor in accordance with claim 2, wherein said nitride film is served as a blocking means such that the thick insulating film is merely formed on the high concentration source/drain regions of the second conductivity type.

4. A method of making a metal oxide semiconductor field effect transistor in accordance with claim 1, wherein said thick insulating film is an oxide film.

5. A method of making a metal oxide semiconductor field effect transistor in accordance with claim 4, wherein the thickness of the oxide film is 1000Å to 1500Å.

6. A method of making a metal oxide semiconductor field effect transistor in accordance with claim 4, wherein the oxide film is formed by a LOCOS process.

7. A method of making a metal oxide semiconductor field effect transistor in accordance with claim 1, wherein the gate cap insulating film is an oxide film.

8. A method of making a metal oxide semiconductor field effect transistor in a accordance with claim 7, wherein the gate cap oxide film is formed by oxidizing the upper portion of the polysilicon for the gate with a LOCOS process.

9. A method of making a metal oxide semiconductor field effect transistor comprising the steps of;
   forming a field region in a substrate of a first conductivity type to define the field region and an active region;
   forming a gate oxide film on the active region;
   implanting an impurity in the active region to control a threshold voltage;
   forming a polysilicon film over the whole surface of the substrate;
   etching the polysilicon film and the gate oxide film to form the gate electrode on the active region;
   forming a thin insulating film over the whole surface of the substrate;
   forming a semiconductor layer on the thin insulating film;
   anisotopically etching the thin insulating film and the semiconductor layer with a RIE method to form sidewall spacers at side surfaces of the gate electrode and the gate oxide film;
   implanting a high concentration impurity of a second conductivity type to form high concentration source/drain regions of a second conductivity type, by self-aligning with the sidewall spacers as a mask;
   removing the semiconductor layer for sidewall spacers; forming a thick insulating film and a gate cap insulating film;
   removing the thin insulating film for sidewall spacers; and implanting a low concentration impurity of a second conductivity type and a low concentration impurity of a first conductivity type self-aligning with the gate electrode and the thick insulating film as a mask, to form low concentration source/drain regions of a second conductivity type coming into contact with high concentration source/drain regions and to form a low concentration impurity region of a first conductivity type enclosing low concentrating source/drain regions of the second conductivity type, in the active region.

10. A method of making a metal oxide semiconductor field effect transistor in accordance with claim 9, wherein the thin insulating film for sidewall spacers is a nitride film.

11. A method of making a metal oxide semiconductor field effect transistor in accordance with claim 9, wherein the semiconductor layer for sidewall spacers is a polysilicon film.

12. A method of making a metal oxide semiconductor field effect transistor in accordance with claim 10, wherein the nitride film is served as a blocking means such that the thick insulating film is merely formed on high concentration source/drain regions of the second conductivity type.

* * * * *